(12) United States Patent
Hsu et al.

(10) Patent No.: US 11,127,675 B2
(45) Date of Patent: Sep. 21, 2021

(54) INTERCONNECTION STRUCTURE AND MANUFACTURING METHOD THEREOF

(71) Applicant: UNITED MICROELECTRONICS CORP., Hsin-Chu (TW)

(72) Inventors: Min-Shiang Hsu, Kaohsiung (TW); Yu-Han Tsai, Kaohsiung (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 118 days.

(21) Appl. No.: 16/709,934

(22) Filed: Dec. 11, 2019

(65) Prior Publication Data

US 2021/0159170 A1 May 27, 2021

(30) Foreign Application Priority Data

Nov. 22, 2019 (CN) .......................... 201911153512.0

(51) Int. Cl.
*H01L 23/522* (2006.01)
*H01L 21/768* (2006.01)

(52) U.S. Cl.
CPC .... *H01L 23/5226* (2013.01); *H01L 21/76804* (2013.01); *H01L 21/76829* (2013.01); *H01L 21/76877* (2013.01)

(58) Field of Classification Search
CPC ........... H01L 23/5226; H01L 21/76877; H01L 21/76804; H01L 21/76829
See application file for complete search history.

(56) References Cited

U.S. PATENT DOCUMENTS 7,400,003 B2 * 7/2008 Lee ................... H01L 21/76805
257/291
10,354,912 B2 7/2019 Xu

OTHER PUBLICATIONS

Chen, "A Self-Aligned Air Gap Interconnect Process", 2008 International Interconnect Technology Conference, Jun. 1, 2008.
Ren, "Physical Vapor Deposited AlN as Scalable and Reliable Interconnect Etch-Stop ≤ 10nm Node", 2016 IEEE International Interconnect Technology Conference / Advanced Metallization Conference (IITC/AMC) ,May 23, 2016.

\* cited by examiner

*Primary Examiner* — Stephen W Smoot
*Assistant Examiner* — Vicki B. Booker
(74) *Attorney, Agent, or Firm* — Winston Hsu

(57) ABSTRACT

An interconnection structure includes a first interlayer dielectric layer, a first conductive line, a protection layer, a second interlayer dielectric layer, and a connection plug. The first conductive line is partially disposed in the first interlayer dielectric layer. The protection layer is disposed on the first conductive line and the first interlayer dielectric layer. The protection layer covers a top surface and a sidewall of the first conductive line. The protection layer includes a recess disposed corresponding to the first conductive line in a vertical direction. The second interlayer dielectric layer is disposed on the protection layer. The connection plug penetrates at least a part of the second interlayer dielectric layer and the protection layer for being connected with the first conductive line.

20 Claims, 16 Drawing Sheets

11,127,675 B2

INTERCONNECTION STRUCTURE AND MANUFACTURING METHOD THEREOF

BACKGROUND OF THE INVENTION

1. Field of the Invention

The present invention relates to an interconnection structure and a manufacturing method thereof, and more particularly, to an interconnection structure including a protection layer and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. In the interconnection structure of the integrated circuit, the alignment accuracy requirements for forming connection plugs connecting different metal layers are becoming more and more stringent while the line width of each metal layer and the spacing between the metal layers become smaller, and the manufacturing yield and the process design of the product are influenced accordingly. Therefore, it is necessary to modify the process and the structural design for improving related process window and enhancing manufacturing yield.

SUMMARY OF THE INVENTION

It is one of the objectives of the present invention to provide an interconnection structure and a manufacturing method thereof. A protection layer is formed covering a top surface and a sidewall of a first conductive line before forming a connection plug, the connection plug may be formed by a self-aligned approach, and the related process window and the manufacturing yield may be improved accordingly.

A manufacturing method of an interconnection structure is provided in an embodiment of the present invention. The manufacturing method includes the following steps. Firstly, a first conductive line is formed. At least a part of the first conductive line is formed in a first interlayer dielectric layer. A protection layer is formed on the first conductive line and the first interlayer dielectric layer. The protection layer covers a top surface of the first conductive line and a sidewall of the first conductive line. A recess is formed in the protection layer. The recess is formed corresponding to the first conductive line in a vertical direction. A second interlayer dielectric layer is formed on the protection layer. A connection plug is formed penetrating at least a part of the second interlayer dielectric layer and the protection layer for being connected with the first conductive line.

An interconnection structure is provided in an embodiment of the present invention. The interconnection structure includes a first interlayer dielectric layer, a first conductive line, a protection layer, a second interlayer dielectric layer, and a connection plug. The first conductive line is partially disposed in the first interlayer dielectric layer. The protection layer is disposed on the first conductive line and the first interlayer dielectric layer. The protection layer covers a top surface of the first conductive line and a sidewall of the first conductive line. The protection layer includes a recess disposed corresponding to the first conductive line in a vertical direction. The second interlayer dielectric layer is disposed on the protection layer. The connection plug penetrates at least a part of the second interlayer dielectric layer and the protection layer for being connected with the first conductive line.

An interconnection structure is provided in another embodiment of the present invention. The interconnection structure includes a first interlayer dielectric layer, a first conductive line, an aluminum nitride layer, a second interlayer dielectric layer, and a connection plug. The first conductive line is partially disposed in the first interlayer dielectric layer. The aluminum nitride layer is disposed on the first conductive line and the first interlayer dielectric layer. The aluminum nitride layer covers a top surface of the first conductive line and a sidewall of the first conductive line. The second interlayer dielectric layer is disposed on the aluminum nitride layer. The connection plug penetrates at least a part of the second interlayer dielectric layer and the aluminum nitride layer for being connected with the first conductive line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-12 are schematic drawings illustrating a manufacturing method of the interconnection structure according to the first embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

FIG. 15 and FIG. 16 are schematic drawings illustrating a manufacturing method of an interconnection structure according to a second embodiment of the present invention, wherein FIG. 16 is a schematic drawing in a step subsequent to FIG. 15.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
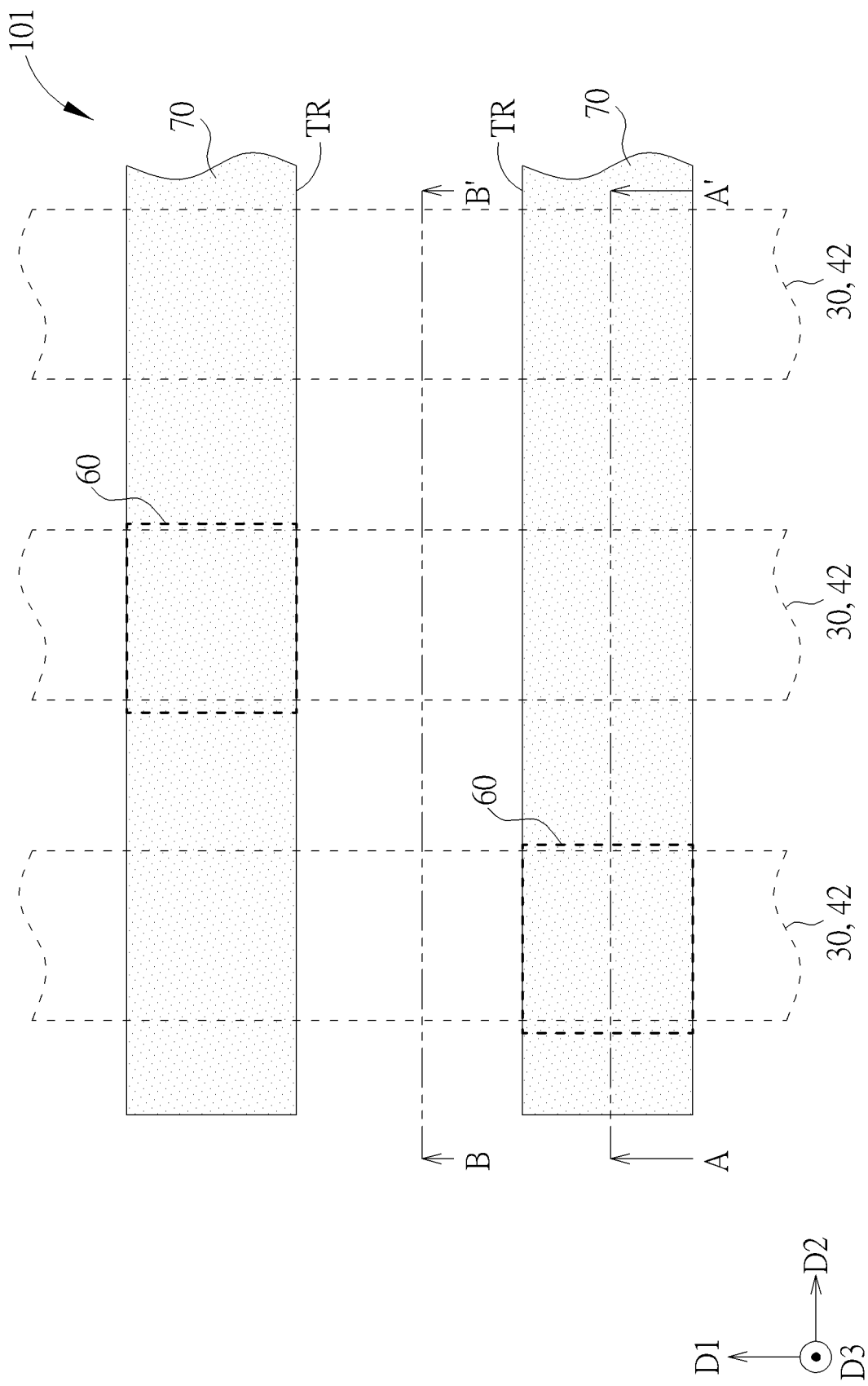
FIG. 1 is a schematic drawing illustrating a top view of an interconnection structure according to a first embodiment of the present invention.
Figure 2:
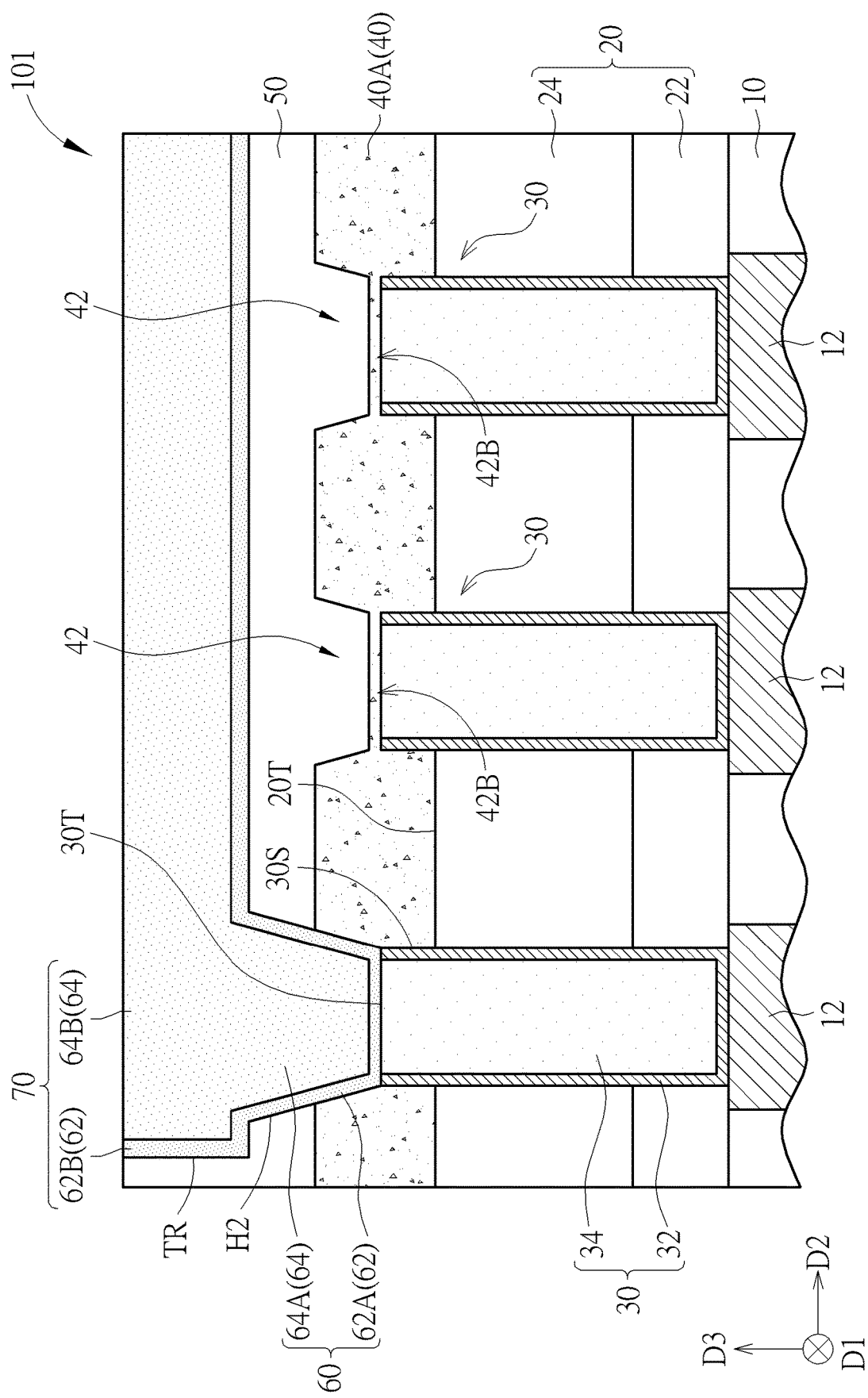
FIG. 2 is a cross-sectional diagram taken along a line A-A' in FIG. 1.
Figure 3:
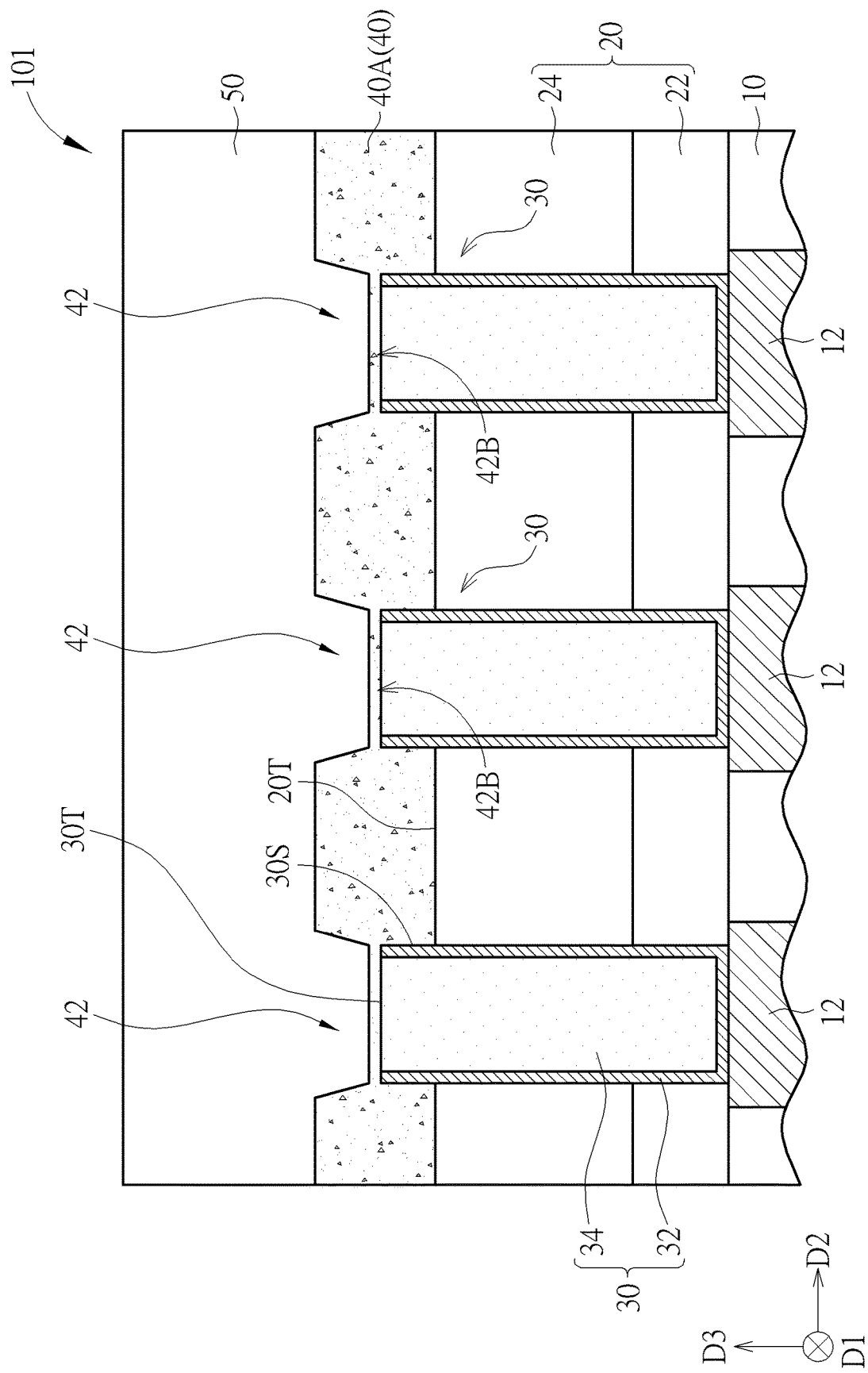
FIG. 3 is a cross-sectional diagram taken along a line B-B' in FIG. 1.

Please refer to FIGS. 1-3. FIG. 1 is a schematic drawing illustrating a top view of an interconnection structure according to a first embodiment of the present invention, FIG. 2 is a cross-sectional diagram taken along a line A-A' in FIG. 1, and FIG. 3 is a cross-sectional diagram taken along a line B-B' in FIG. 1. As shown in FIGS. 1-3, an interconnection structure 101 is provided in this embodiment. The interconnection structure 101 includes a first interlayer dielectric layer 20, a first conductive line 30, a protection layer 40, a second interlayer dielectric layer 50, and a connection plug 60. The first conductive line 30 is partially disposed in the first interlayer dielectric layer 20. The protection layer 40 is disposed on the first conductive line 30 and the first interlayer dielectric layer 20. The protection layer 40 covers a top surface 30T of the first conductive line 30 and a sidewall 30S of the first conductive line 30. The protection layer 40 includes a recess 42, and the recess 42 is disposed corresponding to the first conductive line 30 in a vertical direction D3. The second interlayer dielectric layer 50 is disposed on the protection layer 40. The connection plug 60 penetrates at least a part of the second interlayer dielectric layer 50 and the protection layer 40 for being connected with the first conductive line 30.

In some embodiments, the first interlayer dielectric layer 20 may be disposed on a dielectric layer 10, and the dielectric layer 10 may be disposed on a substrate (not shown), but not limited thereto. The substrate described above may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. For example, a plurality of semiconductor structures (such as field effect transistors, not shown) may be formed on the semiconductor substrate and a dielectric layer covering the field effect transistors (such as the dielectric layer 10 or another dielectric layer under the dielectric layer 10) may be formed before the step of forming the first interlayer dielectric layer 20 according to some design considerations, but not limited thereto. Additionally, in some embodiments, a conductive structure 12 may be disposed in the dielectric layer 10, and the semiconductor structures described above may be electrically connected to the first conductive line 30 upwards via the conductive structure 12, but not limited thereto.

In some embodiments, the interconnection structure 101 may include a plurality of the first conductive lines 30 disposed in the first interlayer dielectric layer 20. Each of the first conductive lines 30 may be elongated in a first direction D1, and the first conductive lines 30 may be arranged repeatedly in a second direction D2, but not limited thereto. The vertical direction D3 described above may be regarded as a thickness direction of the first interlayer dielectric layer 20, the vertical direction D3 may be a direction of a normal of a plane composed of the first direction D1 and the second direction D2, and the vertical direction D3 may be orthogonal to the first direction D1 and the second direction D2 respectively, but not limited thereto. In some embodiments, the interconnection structure 101 may further include a plurality of second conductive lines 70 and a plurality of the connection plugs 60. The second conductive lines 70 may be disposed in the second interlayer dielectric layer 50, and the second conductive lines 70 may be disposed parallel to one another. For instance, each of the second conductive lines 70 may be elongated in the second direction D2, and the second conductive lines 70 may be arranged repeatedly in the first direction D1, but not limited thereto. In other words, the first conductive lines 30 may cross the second conductive lines 70, each of the connection plugs 60 may be disposed at an area where the corresponding first conductive line 30 overlaps the corresponding second conductive line 70 in the vertical direction D3, and each of the second conductive lines 70 may be electrically connected with the corresponding first conductive line 30 via the corresponding connection plug 60.

In some embodiments, the protection layer 40 may include a plurality of the recesses 42, and each of the recesses 42 may be disposed corresponding to one of the first conductive lines in the vertical direction D3, and an elongation direction of each of the recesses 42 may be parallel to an elongation direction of each of the first conductive lines 30 accordingly, but not limited thereto. For example, each of the recesses 42 may be elongated in the first direction D1, and the recesses 42 may be arranged repeatedly in the second direction D2, but not limited thereto. In other words, the elongation direction of each of the recesses 42 (such as the first direction D1) and the elongation direction of each of the second conductive lines 70 (such as the second direction D2) may be orthogonal to the vertical direction D3 respectively, and the elongation direction of each of the recesses 42 may be different from the elongation direction of each of the second conductive lines 70. In addition, one of the second conductive lines 70 (such as the second conductive line 70 located at the lower portion of FIG. 1) may be disposed above the corresponding connection plug 60 and may be electrically connected with the corresponding first conductive line 30 (such as the first conductive line 30 located at the left portion of FIG. 1) via this connection plug 60, and another one of the second conductive lines 70 (such as the second conductive line 70 located at the upper portion of FIG. 1) may overlap a part of the recess 42 (such as the recess 42 located at the left portion of FIG. 1) in the vertical direction D3 and may be electrically insulated from the first conductive line 30 under this recess 42 (such as the first conductive line 30 located at the left portion of FIG. 1). In other words, each of the second conductive lines 70 may overlap more than one of the recesses 42 and more than one of the first conductive lines 30, but the connection plug 60 may be disposed only at an area where the first conductive line 30 overlaps the second conductive line 70 in the vertical direction D3 and this conductive line 30 has to be electrically connected with this second conductive line 70. The first conductive line 30 may be electrically insulated from the second conductive line 70 by the second interlayer dielectric layer 50 and/or the protection layer 40 when there is not any connection plug 60 disposed at the area where the first conductive line 30 overlaps the second conductive line 70 in the vertical direction D3.

In some embodiments, each of the recesses 42 may not penetrate the protection layer 40 located on the corresponding first conductive line 30 in the vertical direction D3. In other words, a part of the protection layer 40 may be located between a bottom 42B of each of the recesses 42 and the first conductive line 30 disposed corresponding to this recess 42, and each of the connection plugs 60 may penetrate the protection layer 40 located between the bottom 42B of the corresponding recess 42 and the corresponding first conductive line 30 in the vertical direction D3. In some embodiments, the topmost surface of the protection layer 40 far from the first interlayer dielectric layer 20 in the vertical direction D3 may be higher than the top surface of the protection layer 40 located on the first conductive line 30 in the vertical direction D3, and the thickness (or the maximum of the thickness) of a part the protection layer 40 which does not overlap the first conductive line 30 in the vertical direction D3 may be greater than the thickness (or the maximum of the thickness) of a part the protection layer 40 overlapping the first conductive line 30 in the vertical direction D3, but not limited thereto. In some embodiments, the protection layer 40 may directly contact the top surface 30T of each of the first conductive lines 30 (may also be regarded as the topmost surface of the first conductive line 30 in the vertical direction D3), the sidewall 30S of each of the first conductive lines 30, and a top surface 20T of the first interlayer dielectric layer 20 (may also be regarded as the topmost surface of the first interlayer dielectric layer 20 in the vertical direction D3), but not limited thereto. In addition, the top surface 20T of the first interlayer dielectric layer 20 may be lower than the top surface 30T of each of the first conductive lines 30 in the vertical direction D3, and each of the first conductive lines 30 may be partly disposed in the first interlayer dielectric layer 20 and partly protrude upwards from the top surface 20T of the first interlayer dielectric layer 20 for being partly located outside the first interlayer dielectric layer 20. In other words, the thickness (or the maximum of the thickness) of each of the first conductive lines 30 in the vertical direction D3 may be greater than the thickness (or the maximum of the thickness) of the first interlayer dielectric layer 20 in the vertical direction D3, but not limited thereto.

In some embodiments, the dielectric layer 10, the first interlayer dielectric layer 20, and the second interlayer dielectric layer 50 may respectively include a single layer of a dielectric material or multiple layers of dielectric materials stacked in the vertical direction D3. The dielectric materials may include silicon oxide, silicon nitride, silicon carbonitride, fluorosilicate glass (FSG), a low dielectric constant (low-k) dielectric material, or other suitable dielectric materials. The low-k dielectric material described above may include a dielectric material having relatively lower dielectric constant (such as a dielectric constant lower than 2.9, but not limited thereto), such as benzocyciclobutene (BCB), hydrogen silsesquioxane (HSQ), methyl silsesquioxane (MSQ), hydrogenated silicon oxycarbide (SiOC—H), and/or porous dielectric materials. For example, the first interlayer dielectric layer 20 may include a first dielectric layer 22 and a second dielectric layer 24 disposed on the first dielectric layer 22, and the material composition of the second dielectric layer 24 may be different from the material composition of the first dielectric layer 22, but not limited thereto.

In some embodiments, the conductive structure 12, each of the first conductive lines 30, each of the connection plugs 60, and each of the second conductive lines 70 may respectively include a conductive material and a barrier layer surrounding this conductive material. The conductive material mentioned above may include a conductive material having relatively lower electrical resistivity, such as copper, aluminum, or tungsten, and the barrier layer mentioned above may include titanium nitride, tantalum nitride, or other suitable electrically conductive barrier materials. For example, each of the first conductive lines 30 may include a first barrier layer 32 and a first conductive material 34, each of the connection plugs 60 may include a first portion 62A of a second barrier layer 62 and a first portion 64A of a second conductive material 64, and each of the second conductive lines 70 may include a second portion 62B of the second barrier layer 62 and a second portion 64B of the second conductive material 64, but not limited thereto. In other words, the second conductive lines 70 and the connection plugs 60 may be formed concurrently by the same materials in some embodiments, but not limited thereto. In some embodiments, the first conductive lines 30 may be regarded as the $N^{th}$ metal layer in the interconnection structure 101 and the second conductive lines 70 may be regarded as the $(N+1)^{th}$ metal layer in the interconnection structure 101, but not limited thereto.

In some embodiments, the material composition of the protection layer 40 may be different from the material composition of the first interlayer dielectric layer 20 and the material composition of the second interlayer dielectric layer 50 preferably for providing required etching selectivity in the manufacturing processes of the interconnection structure 101. For example, the material of the protection layer 40 may include aluminum nitride (AlN) or other suitable dielectric materials having required etching properties (such as etching rate) different from those of the second interlayer dielectric layer 50. Therefore, in some embodiments, the protection layer 40 may be an aluminum nitride layer 40A. The aluminum nitride layer 40A may be disposed on the first conductive line 30 and the first interlayer dielectric layer 20, and the aluminum nitride layer 40A may cover the top surface 30T of the first conductive line 30 and the sidewall 30S of the first conductive line 30. The second interlayer dielectric layer 50 may be disposed on the aluminum nitride layer 40A, and the connection plug 60 may penetrate at least a part of the second interlayer dielectric layer 50 and the aluminum nitride layer 40A for being connected with the corresponding first conductive line 30. In some embodiments, the aluminum nitride layer 40A may directly contact the top surface 30T of each of the first conductive lines 30, the sidewall 30S of each of the first conductive lines 30, and the top surface 20T of the first interlayer dielectric layer 20, but not limited thereto.

Figure 4:
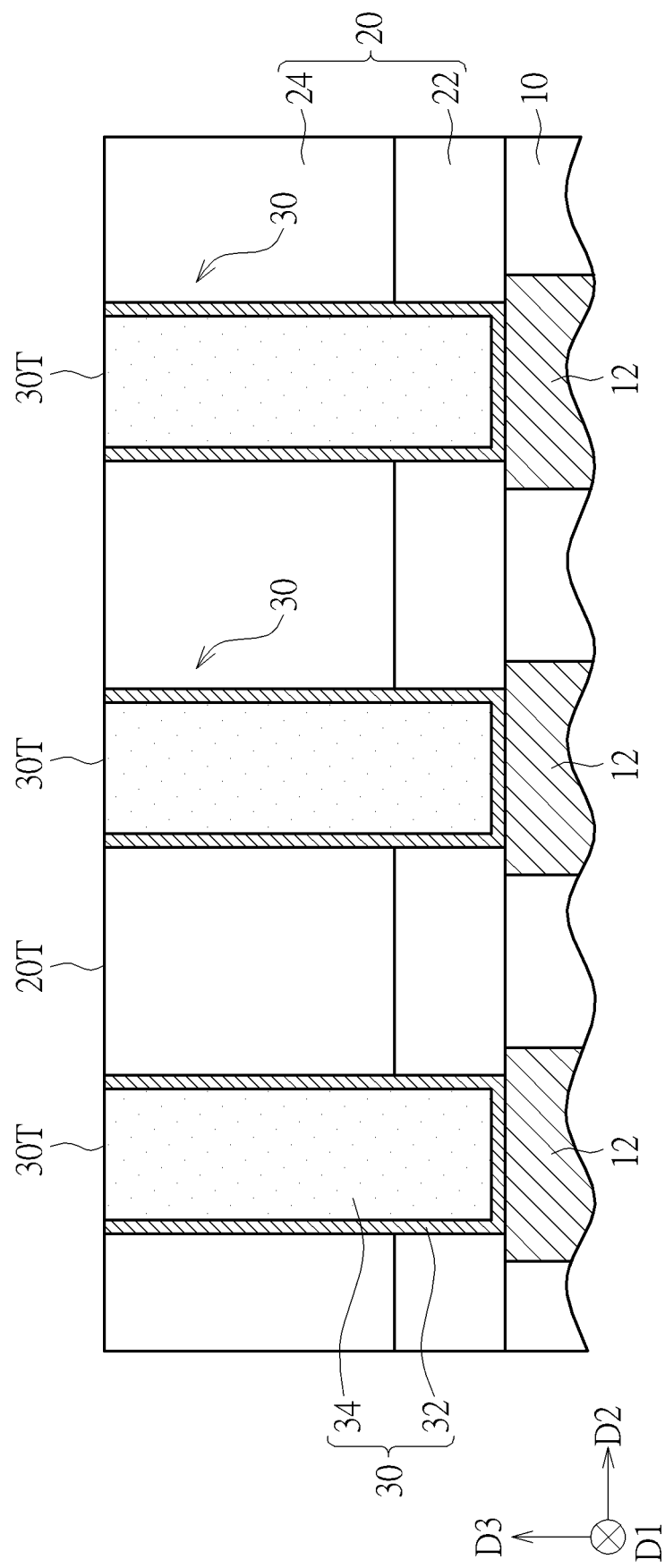
Figure 5:
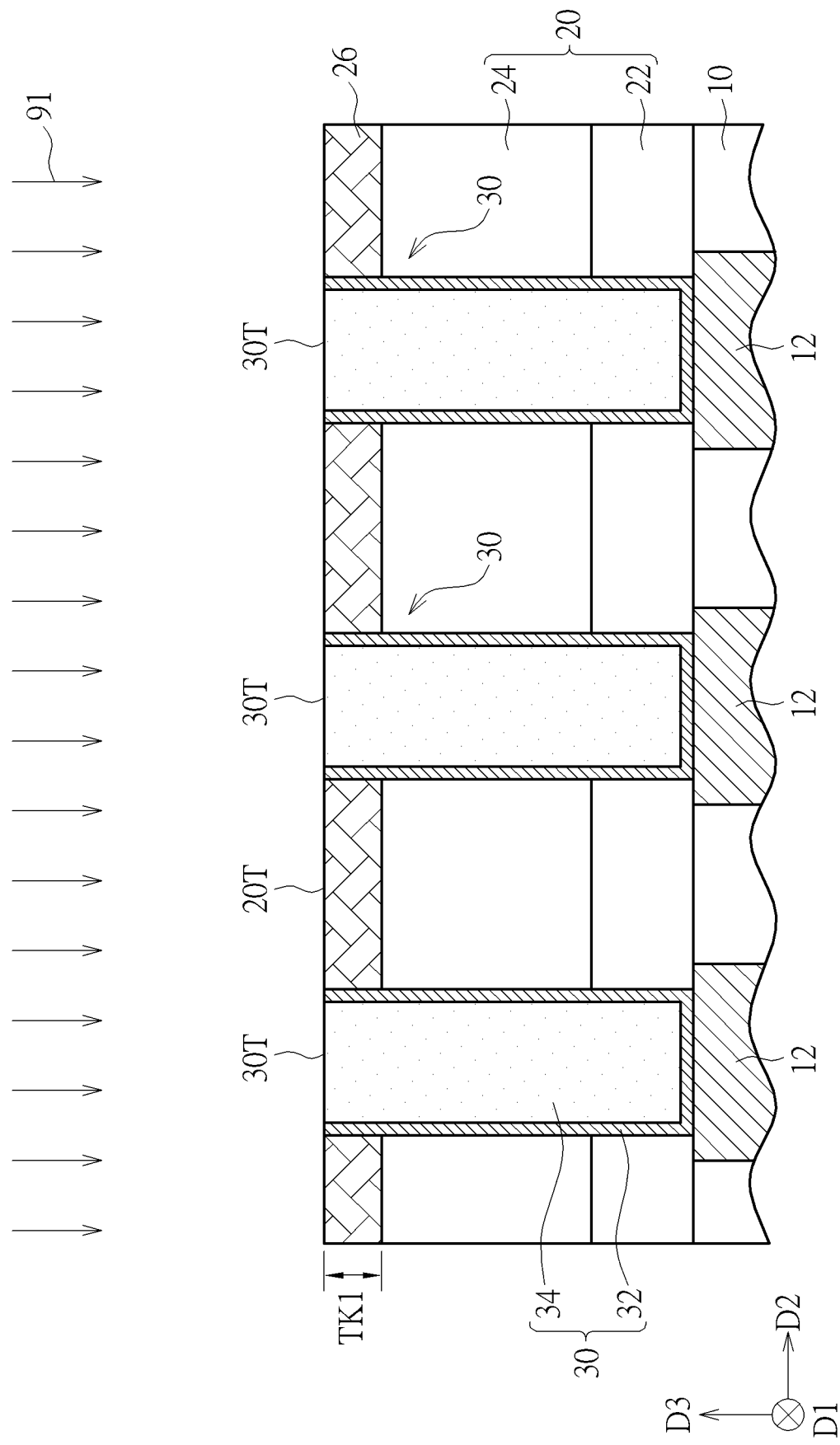
Figure 6:
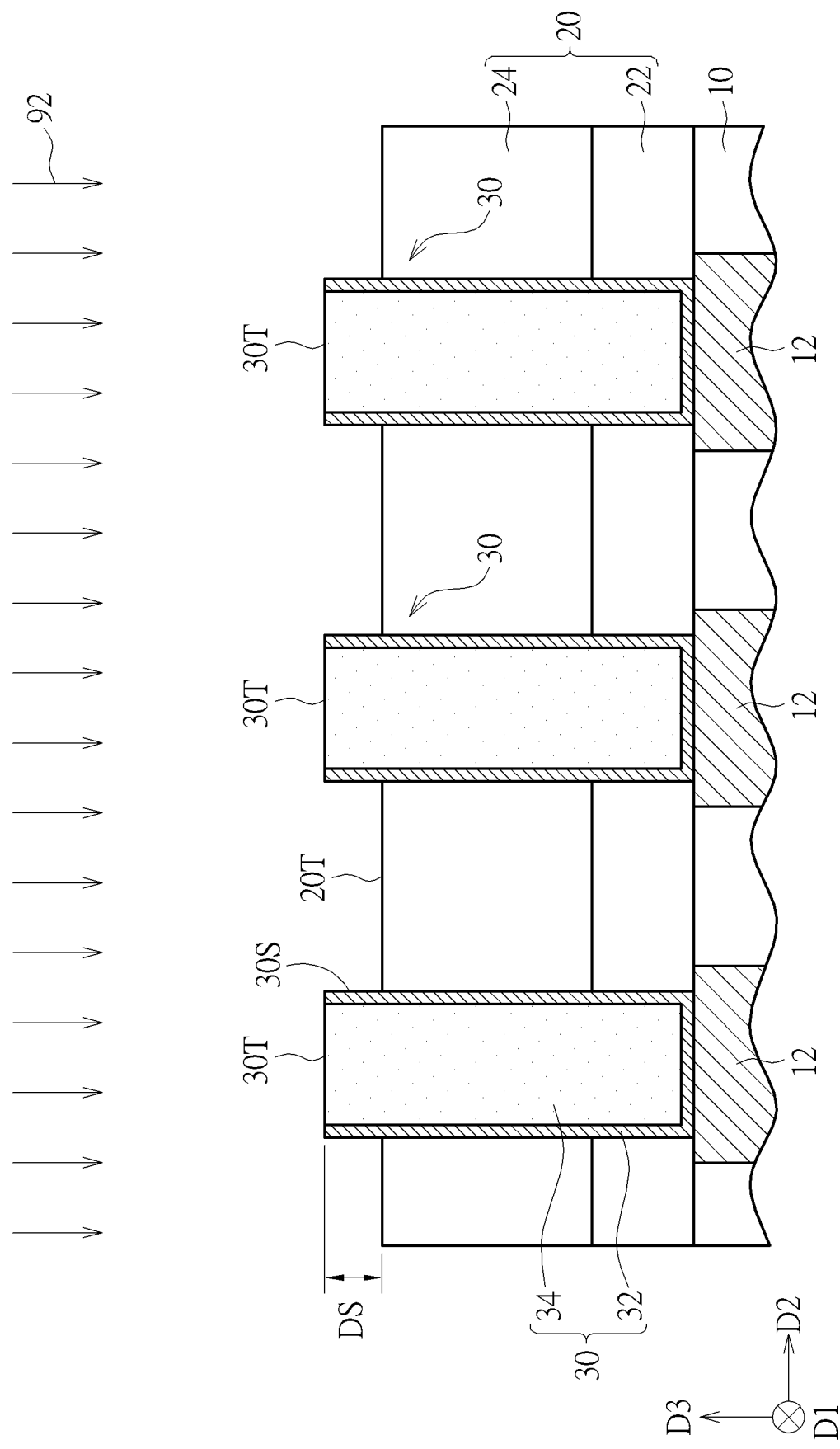
Figure 7:
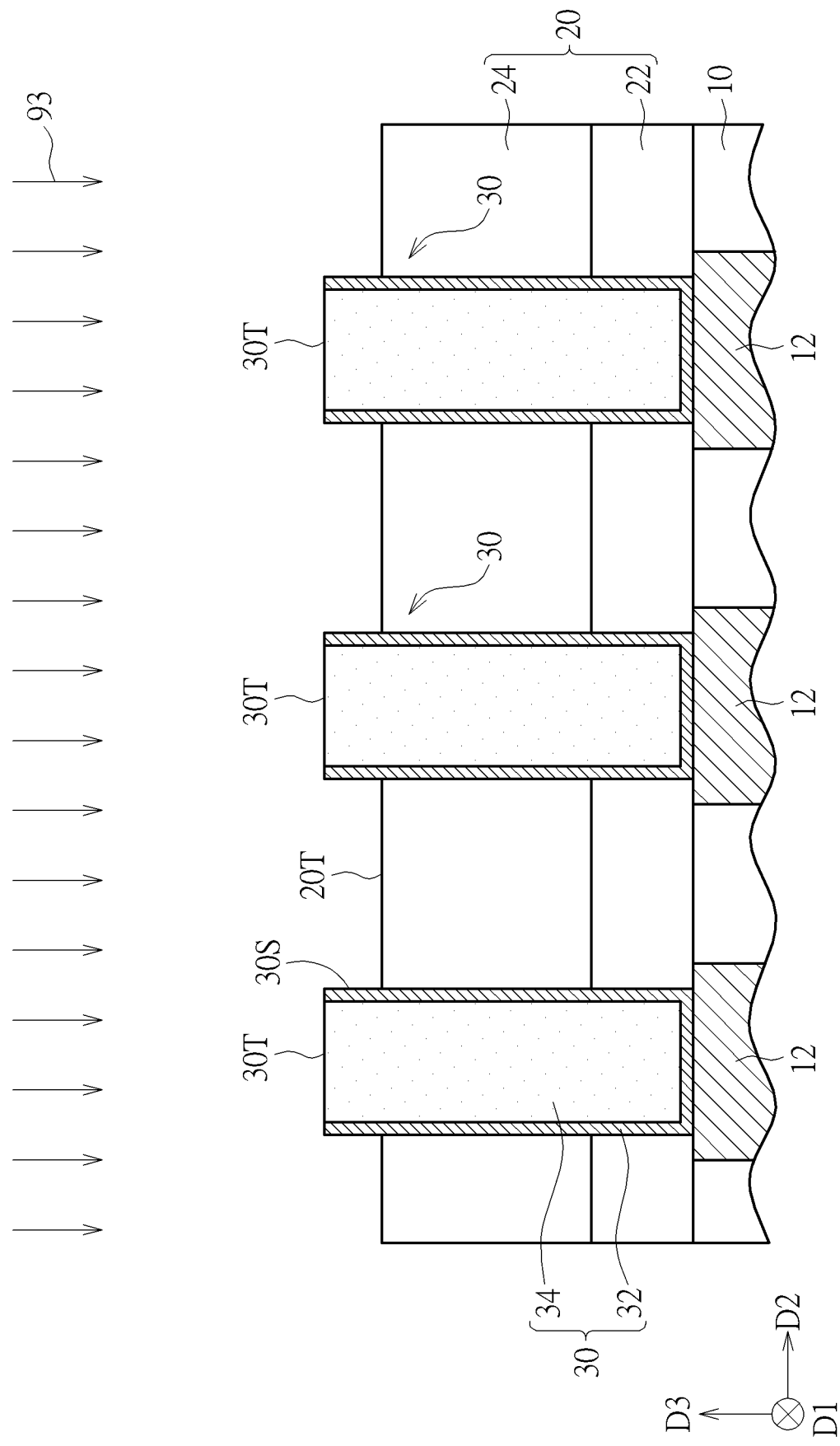
Figure 8:
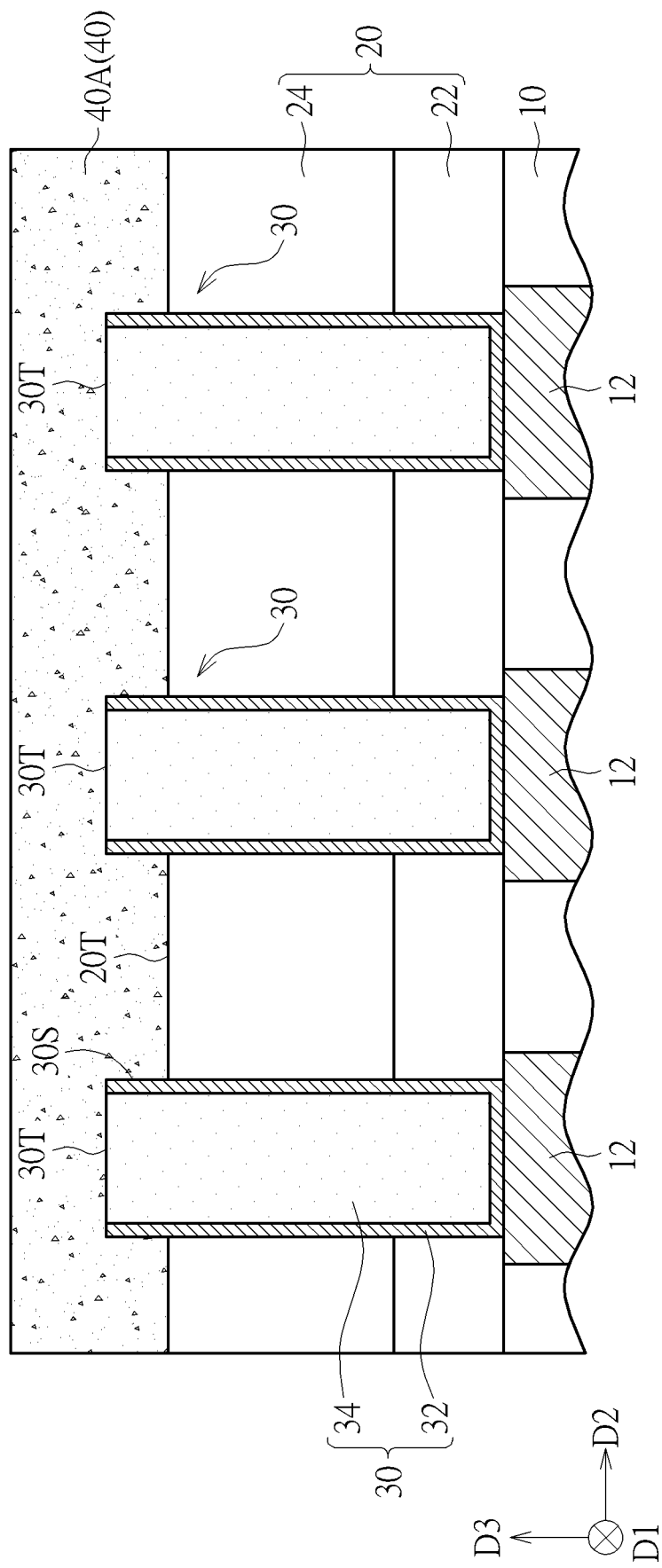
Figure 9:
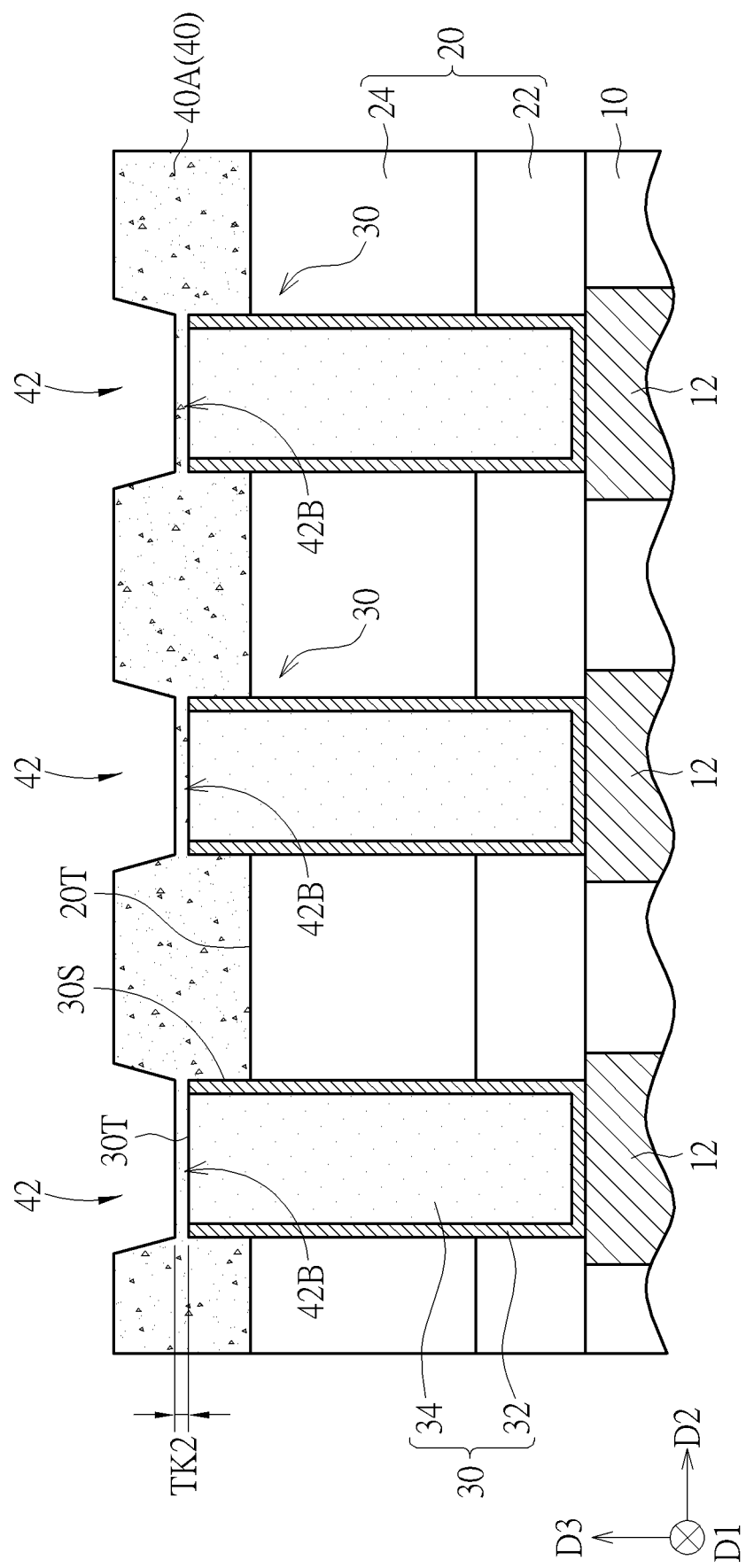
Figure 10:
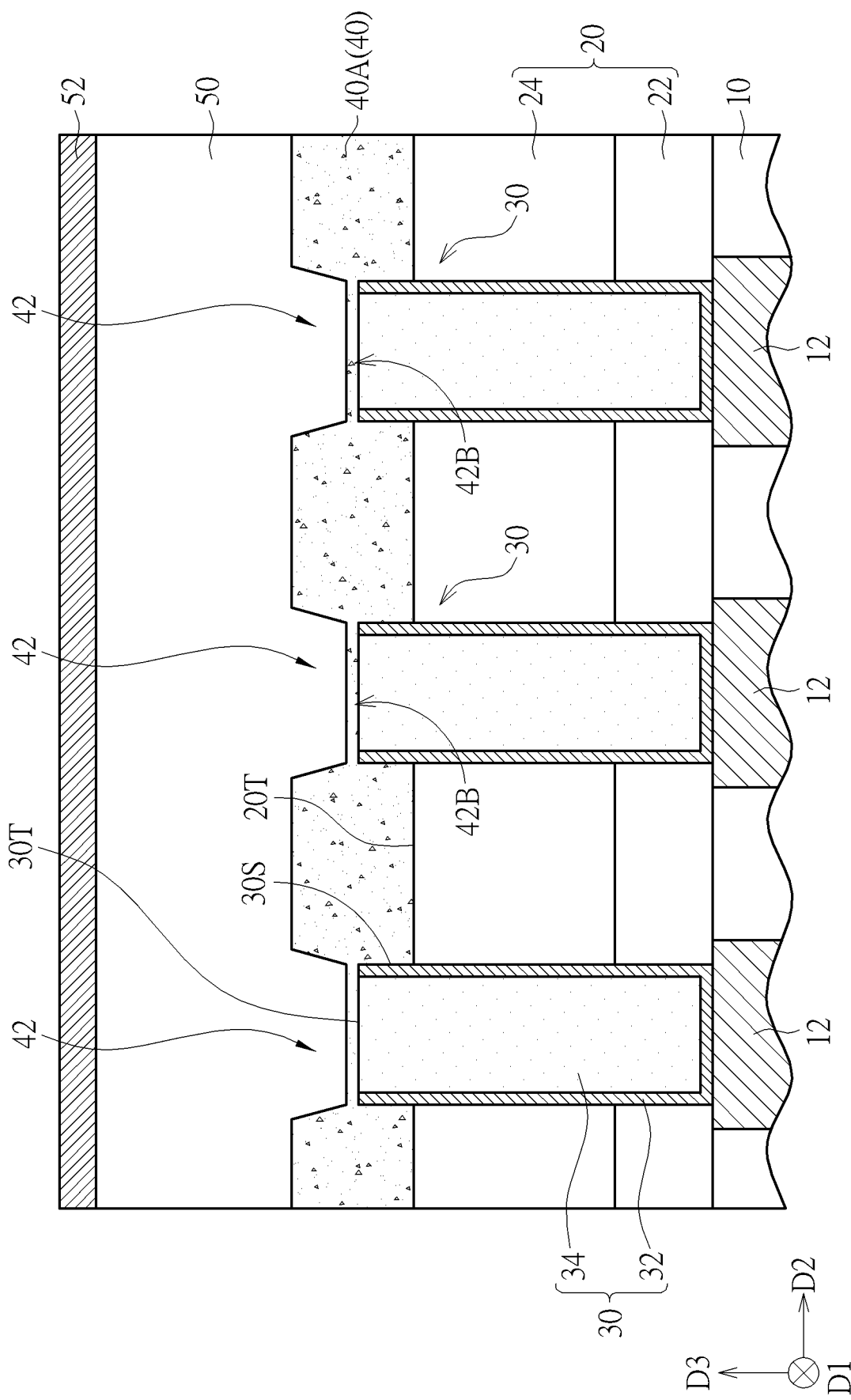
Figure 11:
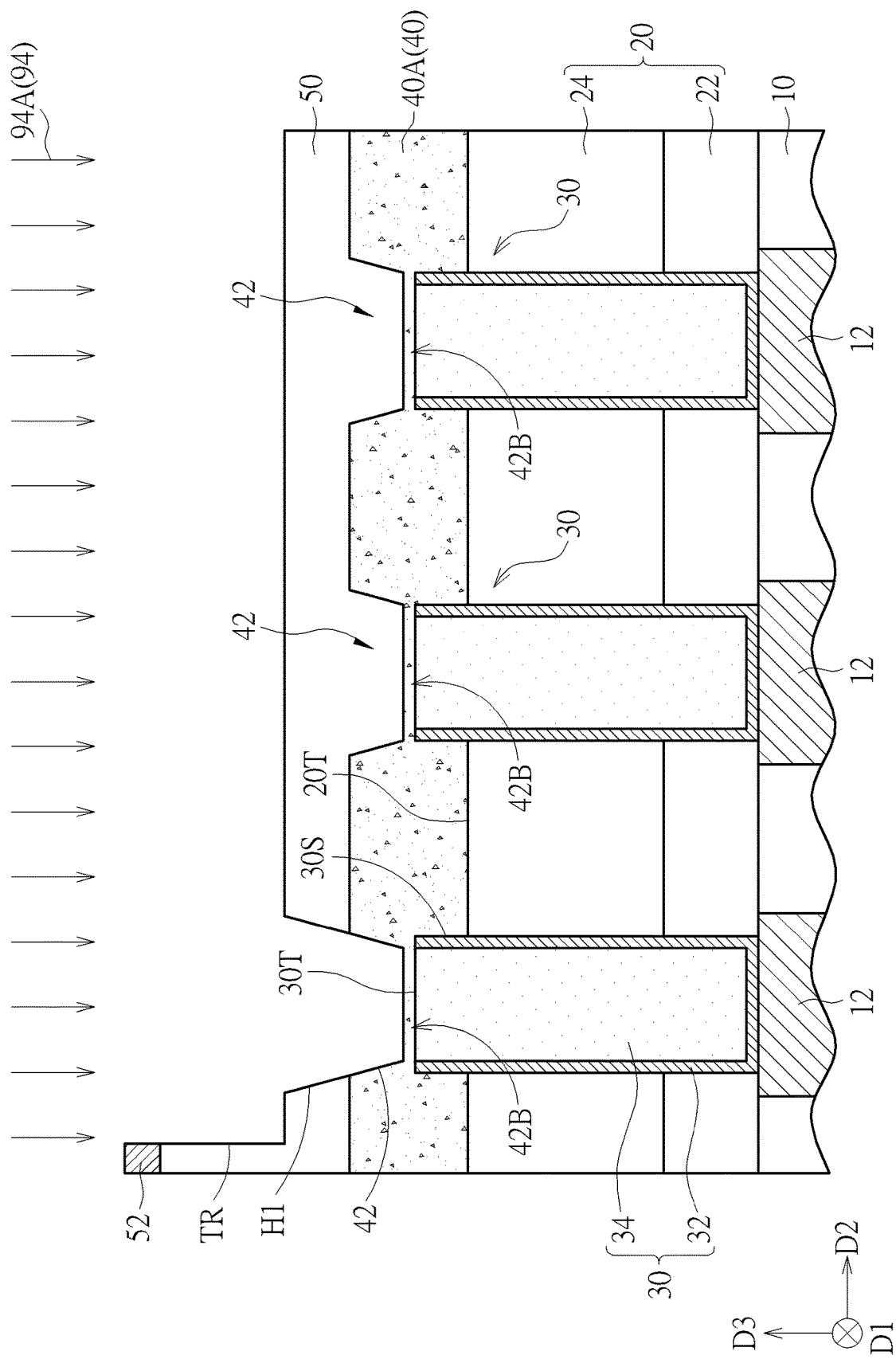
Figure 12:
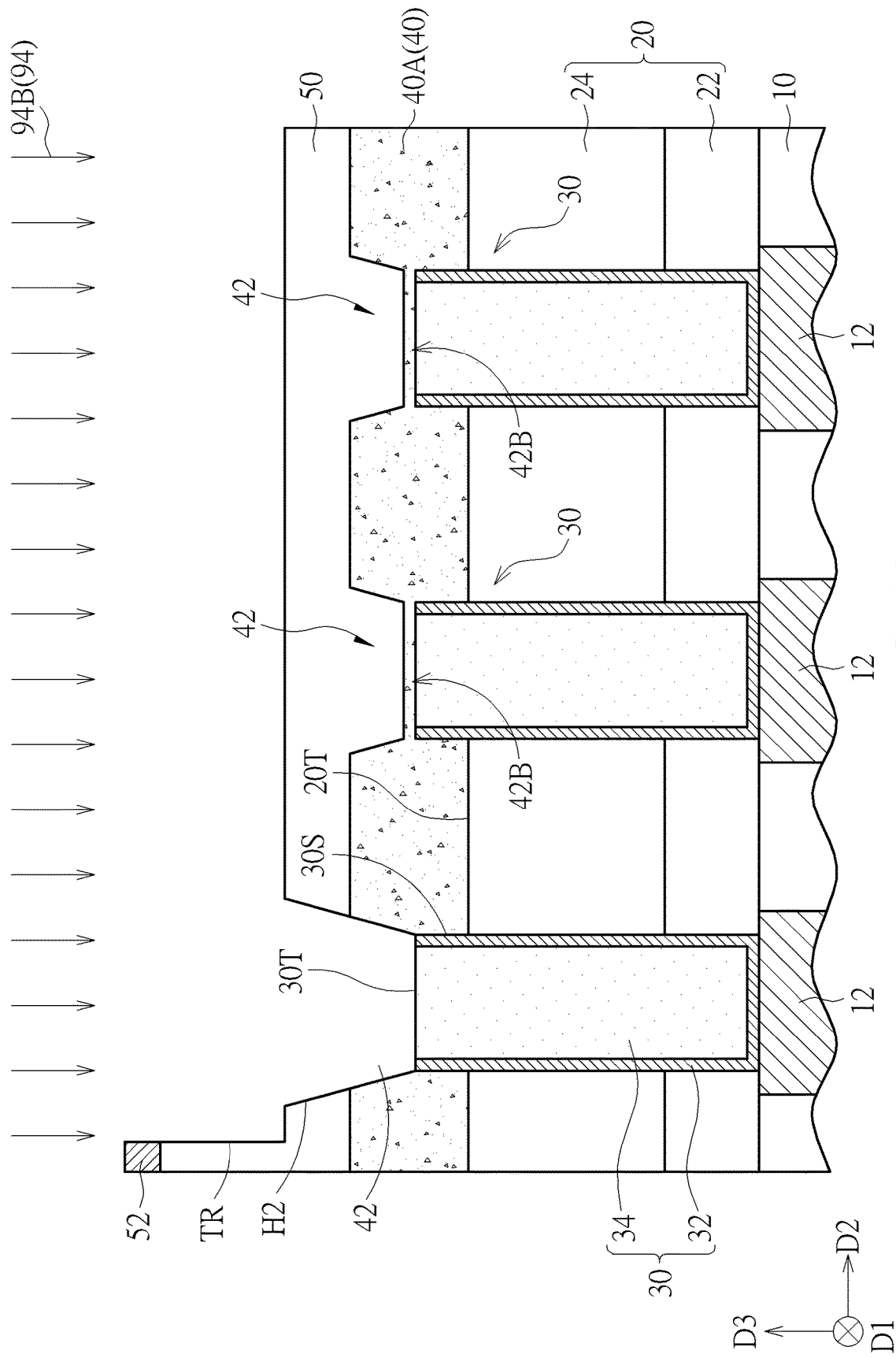

Please refer to FIGS. 1-12. FIGS. 4-12 are schematic drawings illustrating a manufacturing method of the interconnection structure according to the first embodiment of the present invention. FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, and FIGS. 1-3 may be regarded as schematic drawings in a step subsequent to FIG. 12. As shown in FIGS. 1-3, the manufacturing method of the interconnection structure 101 in this embodiment may include the following steps. Firstly, the first conductive line 30 is formed. At least a part of the first conductive line 30 is formed in the first interlayer dielectric layer 20. The protection layer 40 is formed on the first conductive line 30 and the first interlayer dielectric layer 20. The protection layer 40 covers the top surface 30T of the first conductive line 30 and the sidewall 30S of the first conductive line 30. The recess 42 is formed in the protection layer 40. The recess 42 is formed corresponding to the first conductive line 30 in the vertical direction D3. The second interlayer dielectric layer 50 is formed on the protection layer 40. The connection plug 60 is formed penetrating at least a part of the second interlayer dielectric layer 50 and the protection layer 40 for being connected with the first conductive line 30.

In some embodiments, the manufacturing method of the interconnection structure 101 may further include forming the second conductive line 70 in the second interlayer dielectric layer 50. The second conductive line 70 may be formed above the connection plug 60, and the second conductive line 70 may be electrically connected with the first conductive line 30 via the connection plug 60. In some embodiments, a plurality of the first conductive lines 30, a plurality of the connection pugs 60, a plurality of the recesses 42, and a plurality of the second conductive lines 70 may be formed. Each of the second conductive lines 70 may overlap more than one of the recesses 42 and more than one of the first conductive lines 30 in the vertical direction D3, the connection plug 60 may be disposed between the first conductive line 30 and the second conductive line 70 which have to be electrically connected with each other, and the second conductive line 70 may be electrically connected with the corresponding first conductive line 30 via the connection plug 60.

Specifically, the manufacturing method of the interconnection structure 101 in this embodiment may include but is not limited to the following steps. As shown in FIG. 4, the first interlayer dielectric layer 20 may be formed on the dielectric layer 10, and the conductive structure 12 may be formed in the dielectric layer 10. In some embodiments, each of the first conductive lines 30 may penetrate the first interlayer dielectric layer 20 in the vertical direction D3 for being electrically connected with the corresponding conductive structure 12, but not limited thereto. In some embodiments, a photolithographic process may be performed to the first interlayer dielectric layer 20 for forming through holes in the first interlayer dielectric layer and located corresponding to the conductor structure 12 first, the materials for forming the first conductive lines 30 (such as the first barrier layer 32 and the first conductive material 34) may be formed in the through holes, and a planarization process may be performed to remove the first barrier layer 32 and the first conductive material 34 located outside the through holes for forming the first conductive lines 30, but not limited thereto. In some embodiments, the first conductive lines 30 may also be formed by other manufacturing approaches different from the manufacturing approach described above and/or other materials different from the materials described above according to other design considerations. In addition, when the planarization process described above is applied to form the first conductive lines 30, the top surface 20T of the first interlayer dielectric layer 20 and the top surface 30T of each of the first conductive lines 30 may be substantially coplanar, but not limited thereto.

Subsequently, as shown in FIGS. 4-6, in some embodiments, a part of the first interlayer dielectric layer 20 may be removed for lowering the top surface 20T of the first interlayer dielectric layer 20 and exposing a part of the sidewall 30S of each of the first conductive lines 30. The method of removing the part of the first interlayer dielectric layer 20 described above may include but is not limited to the following steps. Firstly, as shown in FIG. 4 and FIG. 5, a surface treatment 91 may be performed to the first interlayer dielectric layer 20 after the first conductive lines 30 are formed, and a part of first interlayer dielectric layer 20 (such as a part adjacent to the top surface 20T) may be converted into a treated layer 26 by the surface treatment 91. As shown in FIG. 5 and FIG. 6, a removing process 92 may be performed subsequently for removing the treated layer 26.

In some embodiments, the surface treatment 91 may include a plasma treatment or other suitable surface treatment approaches, and the treated layer 26 may include a plasma damaged layer, but not limited thereto. In some embodiments, the surface treatment 91 may be used to alter the physical structure of the first interlayer dielectric layer 20 located adjacent to the top surface 20T, and the removing process 92 having higher etching selectivity between the treated layer 26 and the first interlayer dielectric layer 20 (such as the second dielectric layer 25) and/or higher etching selectivity between the treated layer 26 and the first conductive lines 30 may be applied to remove the treated layer 26 completely and reduce negative influence on the first conductive lines 30 and the first interlayer dielectric layer 20. In some embodiments, the removing process 92 may include a wet etching process, such as a wet etching process using dilute hydrofluoric acid (DHF) or a wet etching process using other suitable etchants, but not limited thereto. In some embodiments, the thickness TK1 of the treated layer 26 may be controlled by modifying the process parameters of the surface treatment 91 described above, and the distance DS between the top surface 20T of the first interlayer dielectric layer 20 and the top surface 30T of each of the first conductive lines 30 in the vertical direction D3 after the removing process 92 may be controlled accordingly, but not limited thereto.

As shown in FIGS. 5-8, the protection layer 40 may be formed subsequently and cover the top surface 30T of the first conductive line 30, the sidewall 30S of the first conductive line 30, and the top surface 20T of the first interlayer dielectric layer 20. In other words, a part of the first interlayer dielectric layer 20 (such as the treated layer 26) may be removed before the step of forming the protection layer 40 for exposing a part of the sidewall 30S of each of the first conductive lines 30, and the top surface 20T of the first interlayer dielectric layer 20 may become lower than the top surface 30T of each of the first conductive lines 30 in the vertical direction D3 before the step of forming the protection layer 40. Additionally, in some embodiments, a consolidation treatment 93 may be performed to each of the first conductive lines 30 and/or the first interlayer dielectric layer 20 after the step of removing the treated layer 26 and before the step of forming the protection layer 40 according to some design considerations, and the consolidation treatment 93 may be used to compensate possible negative influence of the surface treatment 91 and/or the removing process 92 on the first conductive lines 30 and the first interlayer dielectric layer 20. The consolidation treatment 93 described above may include a thermal treatment (such as an anneal treatment) or other suitable consolidation treatment approaches. The method of forming the protection layer 40 may include chemical vapor deposition, physical vapor deposition, atomic layer deposition, plasma enhanced atomic layer deposition, or the combination thereof.

Subsequently, as shown in FIG. 9, a plurality of recesses 42 may be formed in the protection layer 40. In some embodiments, a photolithographic process may be performed to form the recesses 42, and a photomask used in this photolithographic process may be identical to a photomask used in the above-mentioned photolithographic process configured for forming the through holes for the first conductive lines 30 for improving the alignment condition between the recesses 42 and the first conductive lines 30 in the vertical direction D3 and reducing the manufacturing cost, but not limited thereto. In some embodiments, each of the recesses 42 may not penetrate the protection layer 40 located on the corresponding first conductive line 30 in the vertical direction D3, the thickness (such as the thickness TK2 shown in FIG. 9) of the protection layer 40 located between the bottom 42B of each of the recesses 42 and the first conductive line 30 disposed corresponding to this recess 42 has to be kept within a specific range for providing a protection effect and/or an etching stop effect by the protection layer 40 in the subsequent etching processes. In other words, the top surface 30T of each of the first conductive lines 30 may be still covered by the protection layer 40 after the recesses 42 are formed.

As shown in FIGS. 10-12 and FIG. 2, the second interlayer dielectric layer 50, the connection plugs 60, and the second conductive lines 70 may be formed subsequently. In some embodiments, the second interlayer dielectric layer 50 may be formed on the protection layer 40, and a hard mask layer 52 may be formed on the second interlayer dielectric layer 50. Contact holes (such as second holes H2 shown in FIG. 12) corresponding to the connection plugs 60 and trenches TR corresponding to the second conductive lines 70 may be formed by performing a photolithographic process using the hard mask layer 52 as a mask, and the second hole H2 may penetrate the protection layer 40 located between the bottom 42B of the corresponding recess 42 and the first conductive line 30, but not limited thereto. For example, the photolithographic process mentioned above may include an etching process 94, the etching process 94 may be performed to the second interlayer dielectric layer 50 and the protection layer 40 for forming the second holes H2 and the trenches TR, and the hard mask layer 52 may be removed after the etching process 94, but not limited thereto. In some embodiments, an etching rate of the protection layer 40 in the etching process 94 may be lower than an etching rate of the second interlayer dielectric layer 50 in the etching process 94 for providing a protection effect and/or an etching stop effect by the protection layer 40 and forming the contact holes (such as the second holes H2) corresponding to the connection plugs 60 by a self-aligned approach.

In some embodiments, the etching process 94 may include a first etching step 94A and a second etching step 94B performed after the first etching step 94A, but not limited thereto. The first etching step 94A may be used to form the trench TR in the second interlayer dielectric layer 50 and form a first hole H1 penetrating the second interlayer dielectric layer 50 under the trench TR for exposing the protection layer 40 and the corresponding recess 42. The etching rate of the protection layer 40 in the first etching step 94A may be much lower than the etching rate of the second interlayer dielectric layer 50 in the first etching step 94A, and the protection layer 40 may be used to provide the protection effect and/or the etching stop effect. Subsequently, the second etching step 94B may be used to etch the protection layer 40 exposed by the first hole H1 for forming the second hole H2 exposing the corresponding first conductive line 30. The first etching step 94A and the second etching step 94B described above may include a dry etching step, a wet etching step, or other suitable etching approaches respectively according to the material composition of the second interlayer dielectric layer 50 and the material composition of the protection layer 40. The process conditions (such as the etching approach, the etching gas, and/or the etchant) of the first etching step 94A may be different from those of the second etching step 94B for providing required etching performance.

It is worth noting that, in some embodiments, the trench TR may be formed first, the first hole H1 may be formed after the step of forming the trench TR for controlling the relative position of the first hole H1 both in the first direction D1 and the second direction D2 and the relative position of the second hole H2 subsequently formed both in the first direction D1 and the second direction D2, and a fully self-aligned result may be obtained accordingly, but not limited thereto. Additionally, in some embodiments, the thickness of the protection layer 40 located between the bottom 42B of each of the recesses 42 and the corresponding first conductive line 30 (such as the thickness TK2 shown in FIG. 9) may be controlled for reducing the required etching time of the second etching step 94B and providing enough protection effect and/or enough etching stop effect by the protection layer 40 in the first etching step 94A still.

Subsequently, as shown in FIG. 12 and FIG. 2, the second barrier layer 62 and the second conductive material 64 may be formed in the trench TR and the second hole H2, and a planarization process may be performed to remove the second barrier layer 62 and the second conductive material 64 outside the trench TR for forming the connection plug 60 in the second hole H2 and forming the second conductive line 70 in the trench TR, but not limited thereto. By the manufacturing method described above, the connection plugs 60 may be formed by a self-aligned approach, the related process window may be improved, and the manufacturing yield may be enhanced accordingly.

Figure 13:
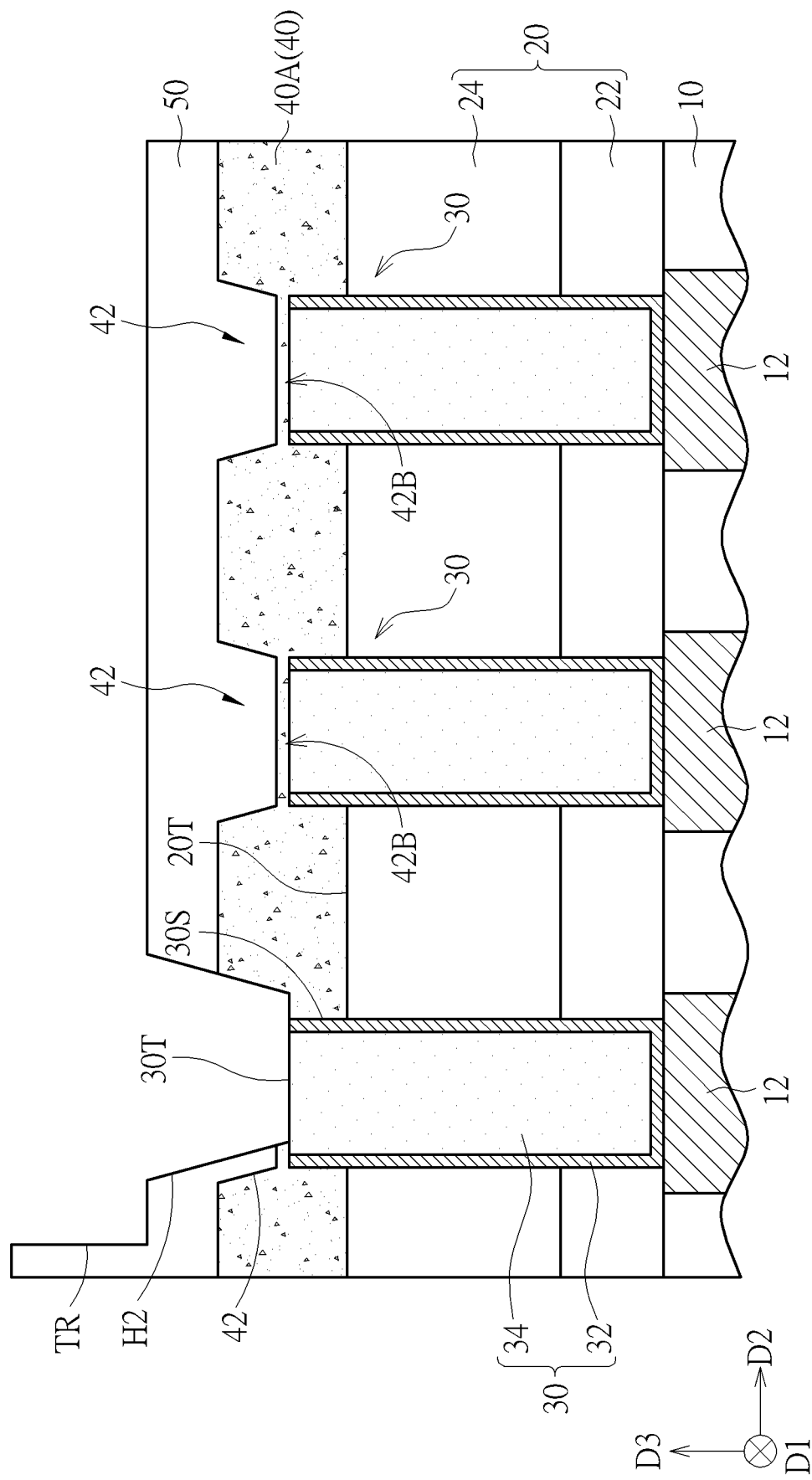
FIG. 13 is a schematic drawing illustrating an alignment shift in the manufacturing method of the interconnection structure according to the first embodiment of the present invention.
Figure 14:
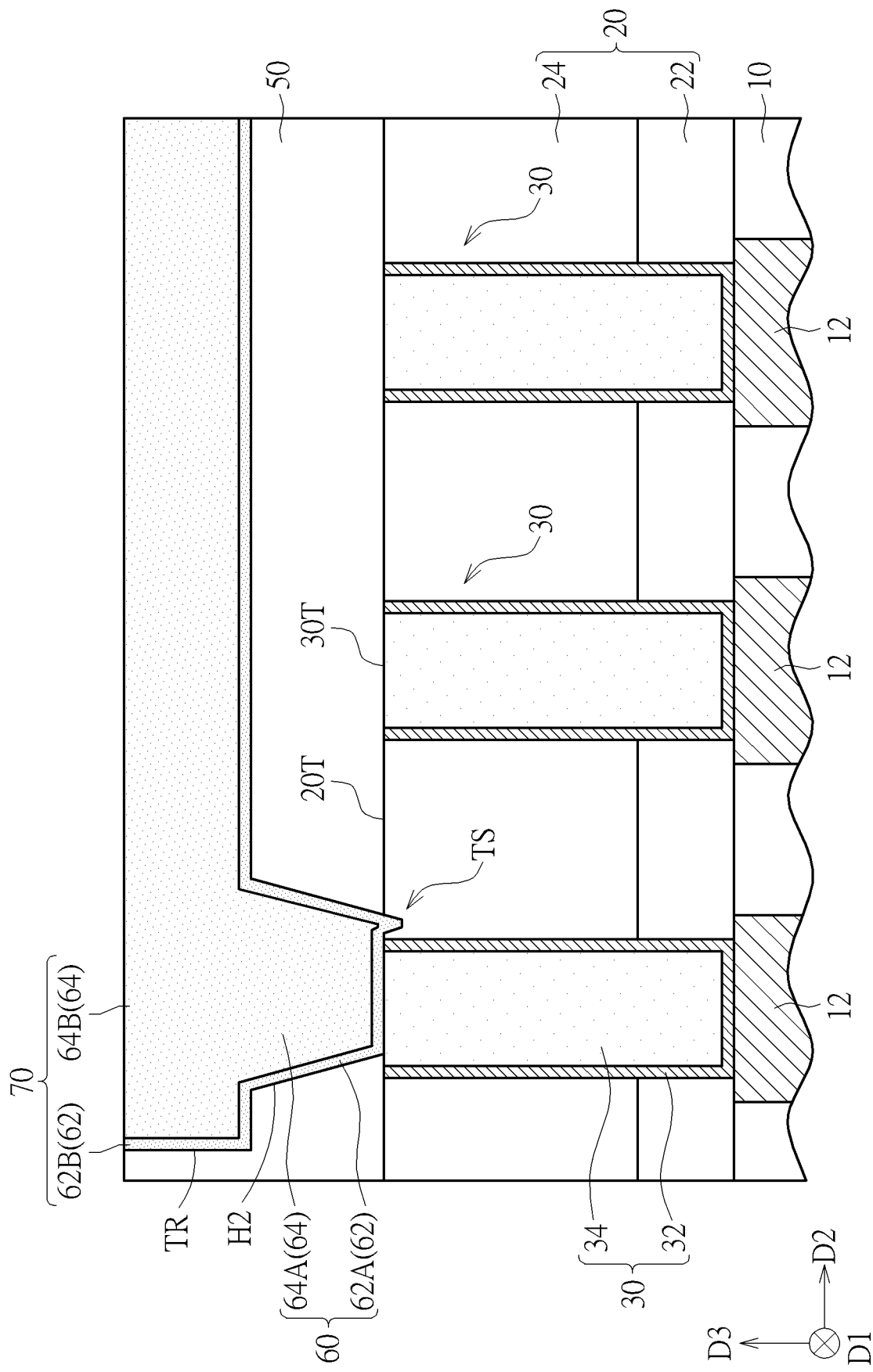
FIG. 14 is a schematic drawing illustrating an alignment shift in a manufacturing method of an interconnection structure according to a comparison embodiment of the present invention.

Please refer to FIG. 2, FIG. 13, and FIG. 14. FIG. 13 is a schematic drawing illustrating an alignment shift in the manufacturing method of the interconnection structure according to the first embodiment of the present invention, and FIG. 14 is a schematic drawing illustrating an alignment shift in a manufacturing method of an interconnection structure according to a comparison embodiment of the present invention. As shown in FIG. 14, the protection layer described above is not formed in the comparison embodiment, and a part of the first interlayer dielectric layer 20 may be removed by the etching process configured to form the second hole H2 and a concave may be formed accordingly when an alignment shift occurs during the step of forming the second hole H2 (such as a shift in the second direction D2). The second barrier layer 62 and the second conductive material 64 subsequently formed may be formed in the concave for forming a protruding structure TS and/or a void in the concave, and the reliability of the interconnection structure will be influenced accordingly. Comparatively, as shown in FIG. 13 and FIG. 2, by forming the protection layer 40, the defect shown in FIG. 14 (such as the protruding structure TS) is unlikely to be formed when an alignment shift occurs during the step of forming the second hole H2 because of the higher etching selectivity between the protection layer 40 and the second interlayer dielectric layer 50 and the protection layer 40 covering the sidewall 30S of the first conductive line 30. Therefore, the protection layer 40 may be used to improve the process window and enhance the manufacturing yield.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 15:
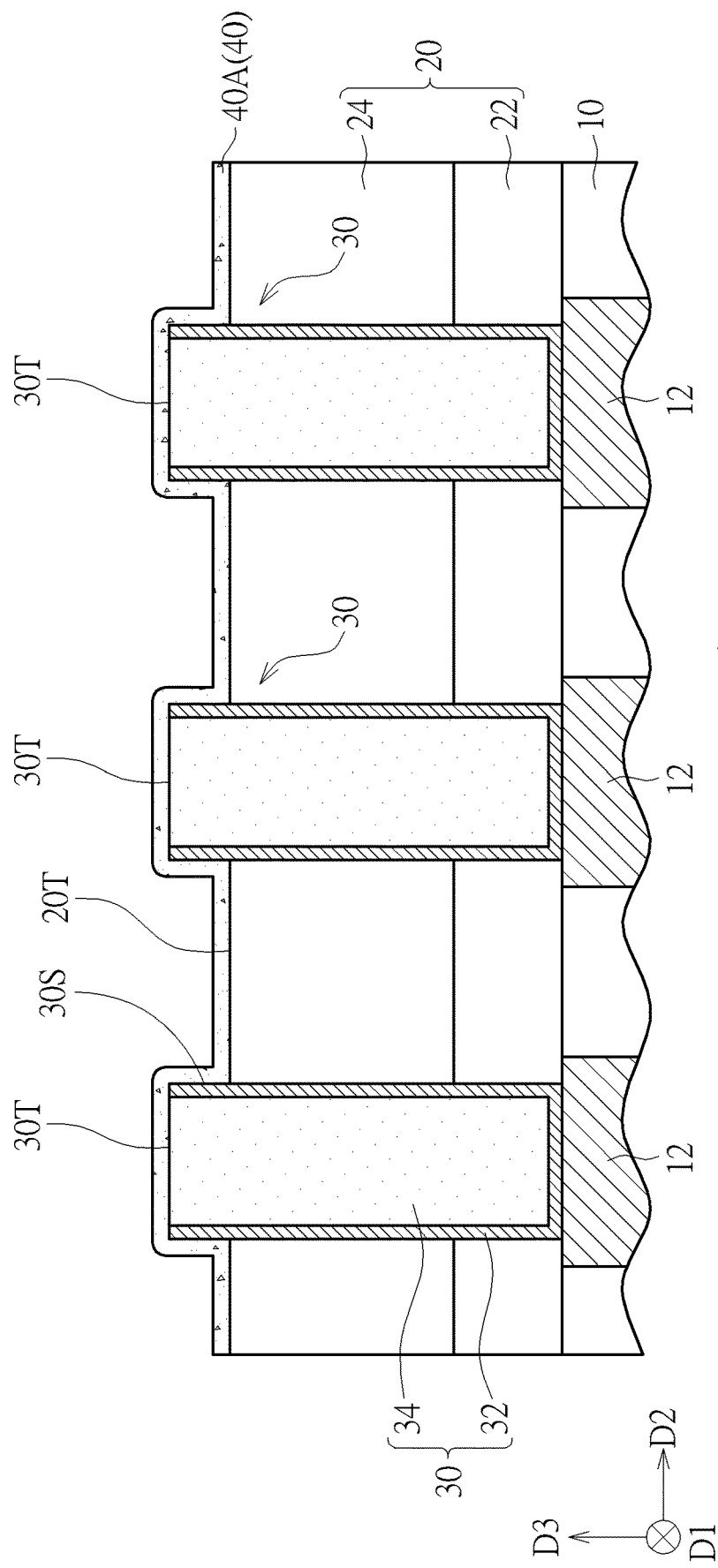
Figure 16:
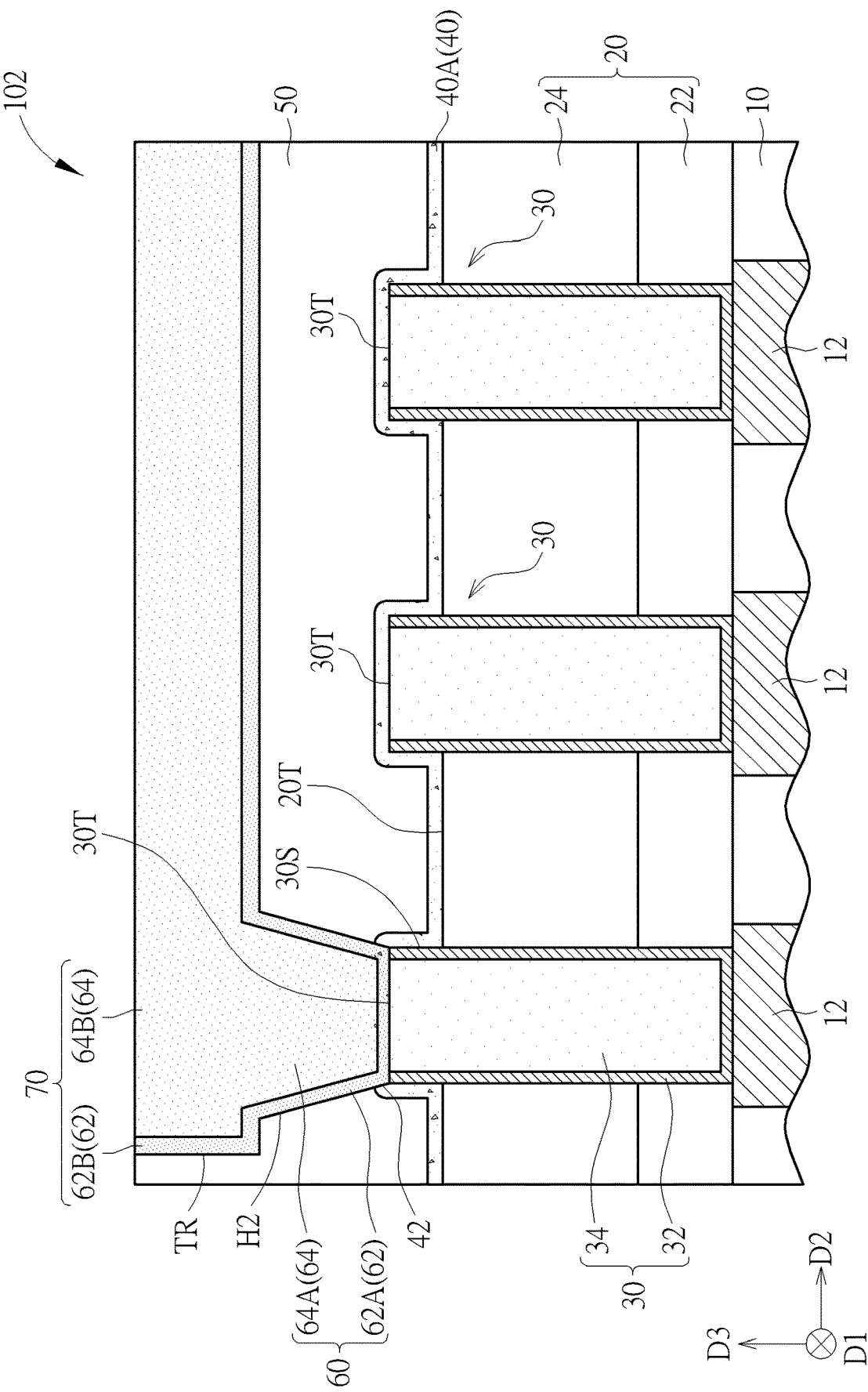

Please refer to FIG. 15 and FIG. 16. FIG. 15 and FIG. 16 are schematic drawings illustrating a manufacturing method of an interconnection structure 102 according to a second embodiment of the present invention, and FIG. 16 is a schematic drawing in a step subsequent to FIG. 15. As shown in FIG. 15 and FIG. 16, the difference between the manufacturing method in this embodiment and the manufacturing method in the first embodiment described above is that the protection layer 40 in this embodiment may be formed conformally on the top surface 30T of each of the first conductive lines 30, the sidewall 30S of each of the first conductive lines 30, and the top surface 20T of the first interlayer dielectric layer 20. In addition, the protection layer 40 may be an aluminum nitride layer 40A preferably, but not limited thereto. Therefore, in the interconnection structure 102, the aluminum nitride layer 40A may be conformally disposed on the top surface 30T of each of the first conductive lines 30, the sidewall 30S of each of the first conductive lines 30, and the top surface 20T of the first interlayer dielectric layer 20. The thickness of the aluminum nitride layer 40A located on the top surface 20T of the first interlayer dielectric layer 20, the thickness of the aluminum nitride layer 40A located on the top surface 30T of each of the first conductive lines 30, and the thickness of the aluminum nitride layer 40A located on the sidewall 30s of each of the first conductive lines 30 may be substantially equal to one another, but not limited thereto. Additionally, in some embodiments, when the aluminum nitride layer 40A is conformally disposed on the top surface 30T of each of the first conductive lines 30, the sidewall 30S of each of the first conductive lines 30, and the top surface 20T of the first interlayer dielectric layer 20, the recesses 42 in the manufacturing method described above may be located only at the positions for forming the connection plugs 60, and the recesses 42 may be formed after the step of forming the second interlayer dielectric layer 50. The recess 42 may be regarded as a part of the second hole H2 and/or a temporary condition during the step of forming the second hole H2 (such as a condition that the protection layer 40 on the first conductive line 30 is partially removed but the first conductive line 30 is not exposed yet), but not limited thereto.

To summarize the above descriptions, according to the interconnection structure and the manufacturing method thereof in the present invention, the protection layer is used to cover the top surface and the sidewall of the first conductive line, and the connection plug may be formed by a self-aligned approach accordingly for improving related defects when alignment shifts occur. Therefore, the related process window and the manufacturing yield may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an interconnection structure, comprising:
    forming a first conductive line, wherein at least a part of the first conductive line is formed in a first interlayer dielectric layer;
    forming a protection layer on the first conductive line and the first interlayer dielectric layer,
    wherein the protection layer covers a top surface of the first conductive line and a sidewall of the first conductive line;
    forming a recess in the protection layer, wherein the recess is formed corresponding to the first conductive line in a vertical direction;
    forming a second interlayer dielectric layer on the protection layer; and
    forming a connection plug penetrating at least a part of the second interlayer dielectric layer and the protection layer for being connected with the first conductive line.

2. The manufacturing method of the interconnection structure according to claim 1, wherein the top surface of the first conductive line is covered by the protection layer after the recess is formed.

3. The manufacturing method of the interconnection structure according to claim 2, wherein the connection plug is formed in a contact hole penetrating the protection layer located between a bottom of the recess and the first conductive line.

4. The manufacturing method of the interconnection structure according to claim 3, wherein the contact hole is formed by performing an etching process to the second interlayer and the protection layer, and an etching rate of the protection layer in the etching process is lower than an etching rate of the second interlayer dielectric layer in the etching process.

5. The manufacturing method of the interconnection structure according to claim 1, wherein the protection layer directly contacts the top surface of the first conductive line, the sidewall of the first conductive line, and a top surface of the first interlayer dielectric layer.

6. The manufacturing method of the interconnection structure according to claim 1, further comprising:
    removing a part of the first interlayer dielectric layer for exposing a part of the sidewall of the first conductive line before the step of forming the protection layer.

7. The manufacturing method of the interconnection structure according to claim 6, wherein the step of removing the part of the first interlayer dielectric layer comprises:
performing a surface treatment to the first interlayer dielectric layer, wherein a part of the first interlayer dielectric layer is converted into a treated layer by the surface treatment; and removing the treated layer before the step of forming the protection layer.

8. The manufacturing method of the interconnection structure according to claim 7, further comprising:
performing a consolidation treatment to the first conductive line after the step of removing the treated layer and before the step of forming the protection layer.

9. The manufacturing method of the interconnection structure according to claim 1, further comprising:
forming a second conductive line in the second interlayer dielectric layer, wherein the second conductive line is formed above the connection plug, and the second conductive line is electrically connected with the first conductive line via the connection plug.

10. The manufacturing method of the interconnection structure according to claim 1, wherein the protection layer comprises aluminum nitride.

11. An interconnection structure, comprising:
a first interlayer dielectric layer;
a first conductive line partially disposed in the first interlayer dielectric layer;
a protection layer disposed on the first conductive line and the first interlayer dielectric layer,
wherein the protection layer covers a top surface of the first conductive line and a sidewall of the first conductive line, and the protection layer comprises a recess disposed corresponding to the first conductive line in a vertical direction;
a second interlayer dielectric layer disposed on the protection layer; and
a connection plug penetrating at least a part of the second interlayer dielectric layer and the protection layer for being connected with the first conductive line.

12. The interconnection structure according to claim 11, wherein the connection plug penetrates the protection layer located between a bottom of the recess and the first conductive line.

13. The interconnection structure according to claim 11, wherein the protection layer directly contacts the top surface of the first conductive line, the sidewall of the first conductive line, and a top surface of the first interlayer dielectric layer.

14. The interconnection structure according to claim 13, wherein the top surface of the first interlayer dielectric layer is lower than the top surface of the first conductive line in the vertical direction.

15. The interconnection structure according to claim 11, further comprises:
a second conductive line disposed in the second interlayer dielectric layer and disposed above the connection plug, wherein the second conductive line is electrically connected with the first conductive line via the connection plug.

16. An interconnection structure, comprising:
a first interlayer dielectric layer;
a first conductive line partially disposed in the first interlayer dielectric layer;
an aluminum nitride layer disposed on the first conductive line and the first interlayer dielectric layer, wherein the aluminum nitride layer covers a top surface of the first conductive line and a sidewall of the first conductive line;
a second interlayer dielectric layer disposed on the aluminum nitride layer; and
a connection plug penetrating at least a part of the second interlayer dielectric layer and the aluminum nitride layer for being connected with the first conductive line.

17. The interconnection structure according to claim 16, wherein the aluminum nitride layer is conformally disposed on the top surface of the first conductive line, the sidewall of the first conductive line, and a top surface of the first interlayer dielectric layer.

18. The interconnection structure according to claim 17, wherein the aluminum nitride layer directly contacts the top surface of the first conductive line, the sidewall of the first conductive line, and the top surface of the first interlayer dielectric layer.

19. The interconnection structure according to claim 17, wherein the top surface of the first interlayer dielectric layer is lower than the top surface of the first conductive line in a vertical direction.

20. The interconnection structure according to claim 16, further comprises:
a second conductive line disposed in the second interlayer dielectric layer and disposed above the connection plug, wherein the second conductive line is electrically connected with the first conductive line via the connection plug.

* * * * *